(12) United States Patent
Kim et al.

(10) Patent No.: US 8,524,549 B2
(45) Date of Patent: Sep. 3, 2013

(54) METHOD OF FABRICATING THIN-FILM TRANSISTOR SUBSTRATE

(75) Inventors: Hyung-Jun Kim, Yongin-si (KR); Chang-Oh Jeong, Suwon-si (KR); Il-Yong Yoon, Bucheon-si (KR)

(73) Assignee: Samsung Display Co., Ltd., Yongin (KR)

( * ) Notice: Subject to any disclaimer, the term of this patent is extended or adjusted under 35 U.S.C. 154(b) by 154 days.

(21) Appl. No.: 13/191,833

(22) Filed: Jul. 27, 2011

(65) Prior Publication Data
US 2012/0052638 A1 Mar. 1, 2012

(30) Foreign Application Priority Data
Aug. 25, 2010 (KR) .................. 10-2010-0082566

(51) Int. Cl.
*H01L 21/268* (2006.01)
(52) U.S. Cl.
USPC ............ 438/166; 438/158; 257/E21.414; 257/E31.13; 257/E31.131
(58) Field of Classification Search
USPC ............ 438/104, 158; 362/311.02, 311.06, 362/311.1, 311.15
See application file for complete search history.

(56) References Cited

U.S. PATENT DOCUMENTS
2005/0218403 A1* 10/2005 Kuo .................. 257/59

FOREIGN PATENT DOCUMENTS
| JP | 2005-328037 | 11/2005 |
| JP | 2008-166738 | 7/2008 |
| KR | 1020080043417 | 5/2008 |

OTHER PUBLICATIONS
STIC search report.*

* cited by examiner

*Primary Examiner* — Matthew Landau
*Assistant Examiner* — Edward Chin
(74) *Attorney, Agent, or Firm* — H.C. Park & Associates, PLC

(57) ABSTRACT

A method of fabricating a thin-film transistor (TFT) substrate includes forming a gate electrode on a substrate; forming an insulating film on the gate electrode; forming an amorphous semiconductor pattern on the insulating film; and forming a source electrode separated from a drain electrode on the amorphous semiconductor pattern; forming a light-concentrating layer, which includes a protrusion, on the amorphous semiconductor pattern, the source electrode, and the drain electrode; and crystallizing at least part of the amorphous semiconductor pattern by irradiating light to the protrusion of the light-concentrating layer.

25 Claims, 9 Drawing Sheets

US 8,524,549 B2

METHOD OF FABRICATING THIN-FILM TRANSISTOR SUBSTRATE

CROSS REFERENCE TO RELATED APPLICATION

This application claims priority from and the benefit of Korean Patent Application No. 10-2010-0082566, filed on Aug. 25, 2010, which is hereby incorporated by reference for all purposes as if fully set forth herein.

BACKGROUND OF THE INVENTION

1. Field of the Invention

Exemplary embodiments of the present invention relate to a method of fabricating a thin-film transistor (TFT) substrate.

2. Discussion of the Background

Liquid crystal displays (LCDs) are one of the most widely used types of flat panel displays (FPDs). Generally, an LCD includes two substrates having electrodes and a liquid crystal layer interposed between the substrates. In an LCD, voltages are applied to electrodes is formed on two substrates to rearrange liquid crystal molecules of a liquid crystal layer, thereby controlling the amount of light that passes through the liquid crystal layer.

An LCD includes thin-film transistors (TFTs) to rearrange liquid crystal molecules of a liquid crystal layer. A TFT is a device that includes a gate electrode, a source electrode, and a drain electrode formed on a substrate. The TFT further includes a channel region, which is a semiconductor layer between these electrodes, subject to voltages applied to the electrodes.

A polycrystalline semiconductor may be present in the semiconductor layer of a TFT to improve charge mobility and ON current. However, the polycrystalline semiconductor layer is usually formed through a complicated process.

SUMMARY OF THE INVENTION

Exemplary embodiments of the present invention provide a method of fabricating a thin-film transistor (TFT) substrate that may employ simple processes and may increase crystallization efficiency.

Additional features of the invention will be set forth in the description which follows and, in part, will be apparent from the description or may be learned by practice of the invention.

An exemplary embodiment of the present invention discloses a method of fabricating a thin-film transistor (TFT) substrate. The method comprises forming a gate electrode on a substrate; forming an insulating film on the gate electrode; forming an amorphous semiconductor pattern on the insulating film; forming a source electrode and a drain electrode, which are separated from each other, on the amorphous semiconductor pattern; forming a light-concentrating layer comprising a protrusion on the amorphous semiconductor pattern, the source electrode, and the drain electrode, the position of the protrusion corresponding to the source electrode and the drain electrode; and crystallizing at least part of the amorphous semiconductor pattern by irradiating light to the protrusion.

An exemplary embodiment of the present invention also discloses a method of fabricating a thin film transistor (TFT) substrate. The method comprises forming a first gate electrode and a second gate electrode on a substrate; forming a gate insulating film on the first gate electrode and the second gate electrode; forming a first amorphous semiconductor pattern and a second amorphous semiconductor pattern on the gate insulating film, forming a first source electrode and a first drain electrode, which are separated from each other, on the first amorphous semiconductor pattern, and forming a second source electrode and a second drain electrode, which are separated from each other, on the second amorphous semiconductor pattern; forming a light-concentrating layer, which comprises a protrusion disposed on the first amorphous semiconductor pattern under the first source electrode and the first drain electrode, on the first amorphous semiconductor pattern, the second amorphous semiconductor pattern, the first source electrode, the first drain electrode, the second source electrode, and the second drain electrode; and crystallizing at least part of the first amorphous semiconductor pattern by irradiating light to the protrusion of the light-concentrating layer.

An exemplary embodiment of the present invention additionally discloses a method of fabricating a thin film transistor (TFT). The method comprises forming an amorphous semiconductor on a substrate; forming a gate electrode and a source electrode on the amorphous semiconductor, a portion of the amorphous semiconductor being exposed by a separation between the gate electrode and the source electrode; forming a layer comprising a protrusion on the exposed portion of the amorphous semiconductor; and crystallizing at least a part of the exposed amorphous semiconductor by irradiating the protrusion with light. The protrusion focuses the light onto the exposed portion of the amorphous semiconductor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and, together with the description, serve to explain the principles of the invention.

DETAILED DESCRIPTION OF THE ILLUSTRATED EMBODIMENTS

Figure 1:
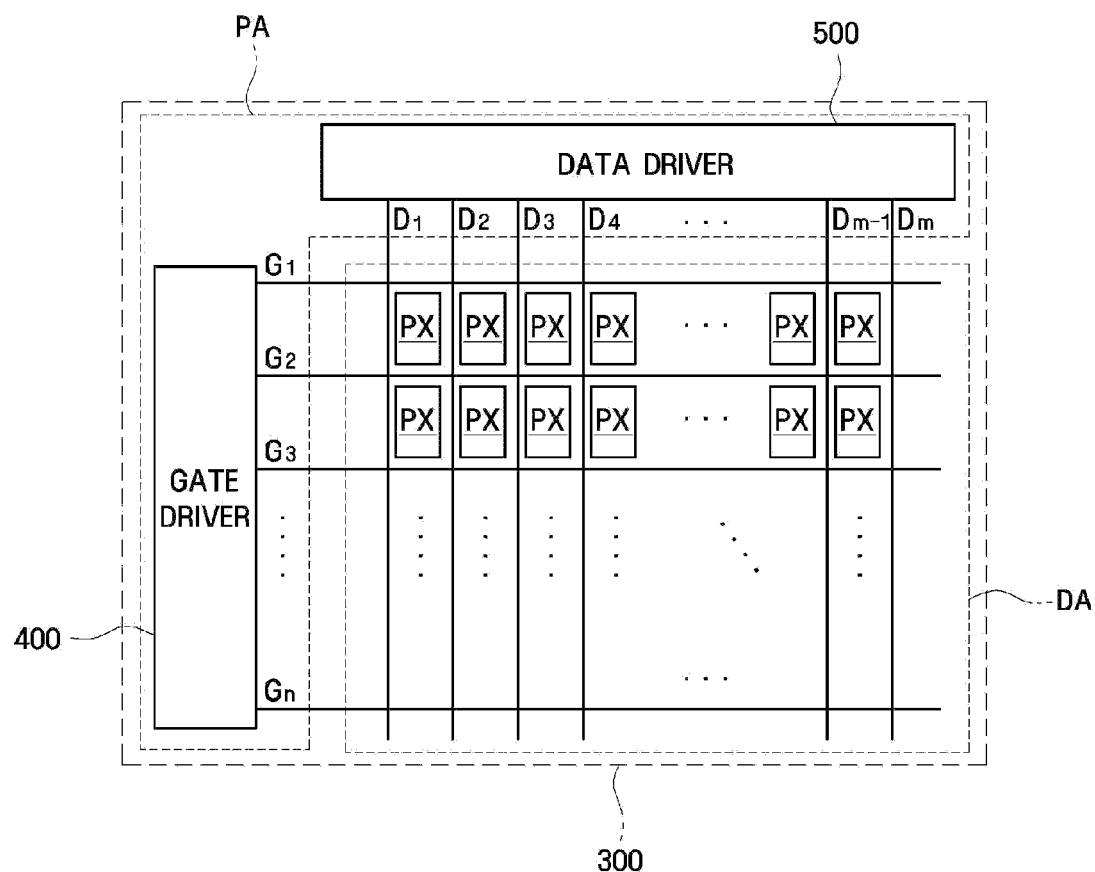
FIG. 1 is a diagram showing a display device that includes a thin-film transistor (TFT) substrate according to exemplary embodiments of the present invention.

The invention is described more fully hereinafter with reference to the accompanying drawings in which embodiments of the invention are shown. This invention may, however, be embodied in many different forms and should not be construed as limited to the embodiments set forth herein. Rather, these embodiments are provided so that this disclosure is thorough and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on," "connected to," or "coupled to" another element or layer, it can be directly on, directly connected to, directly coupled to the other element or layer, or intervening elements or layers may be present. In contrast, when an element is referred to as being "directly on," "directly connected to," or "directly coupled to" another element or layer, there are no intervening elements or layers present.

The terminology used herein is for the purpose of describing exemplary embodiments and is not intended to limit the present invention. As used herein, the singular forms "a", "an" and "the" are intended to include the plural forms as well, unless the context clearly indicates otherwise. It will be further understood that the terms "comprises" and/or "made of," when used in this specification, specify the presence of stated components, steps, operations, and/or elements, but do not preclude the presence or addition of one or more other components, steps, operations, elements, and/or groups thereof.

It will be understood that, although the terms first, second, third, etc., may be used herein to describe various elements, these elements should not be limited by these terms. These terms are only used to distinguish one element from another element.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a display device including a thin-film transistor (TFT) substrate according to exemplary embodiments of the present invention will be described with reference to FIG. 1 and FIG. 2.

Referring to FIG. 1, the display device may include a display panel 300 includes one or two display substrates.

The display panel 300 may be divided into a display area DA in which images are displayed and a non-display area PA that does not display images.

The display area DA may include a first substrate 100 (see FIG. 2) on which a plurality of gate lines G1 through Gn, a plurality of data lines D1 through Dm, a plurality of pixel switching devices Q (see FIG. 2), and a plurality of pixel electrodes PE (see FIG. 2) are formed; a second substrate 200 (see FIG. 2) on which a plurality of color filters CF (see FIG. 2) and a common electrode CE (see FIG. 2) are formed; and a liquid crystal layer 3 (see FIG. 2), which is interposed between the first and second substrates 100 and 200. The gate lines G1 through Gn may extend substantially in a row direction substantially parallel to each other, and the data lines D1 through Dm may extend substantially in a column direction substantially parallel to each other.

Figure 2:
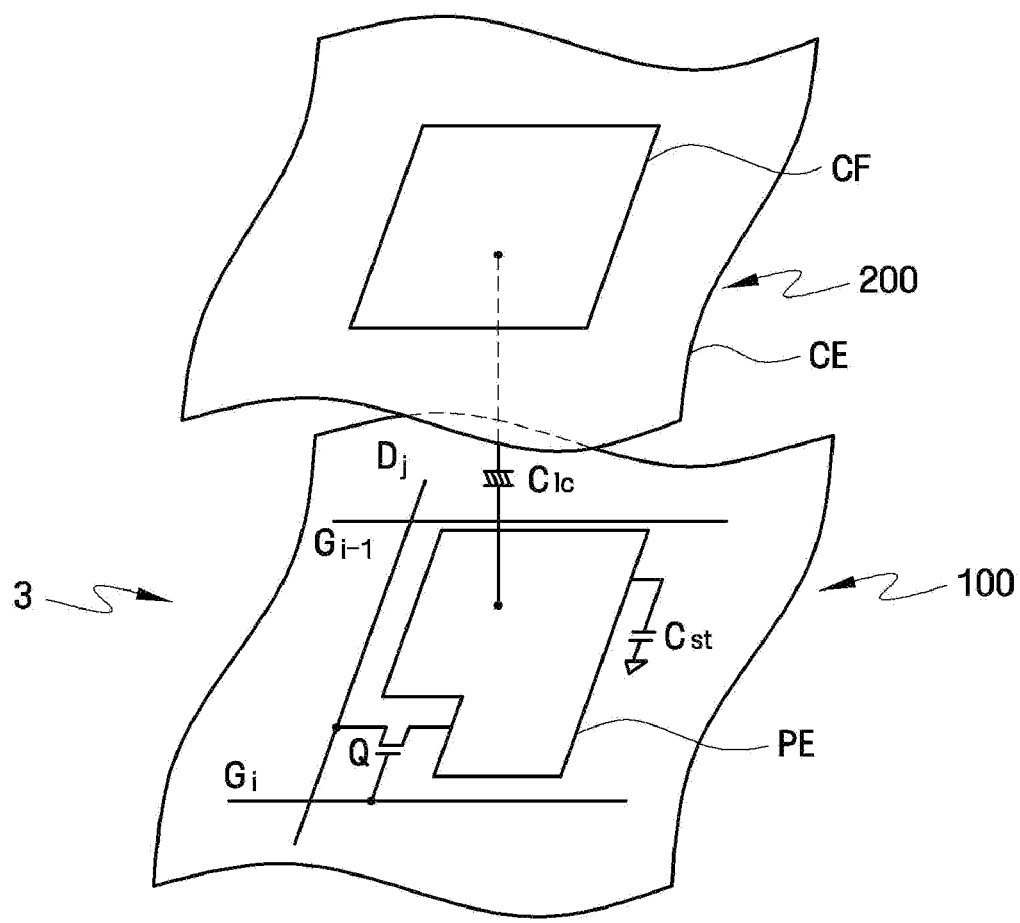
FIG. 2 is an equivalent circuit diagram of a pixel shown in FIG. 1.

Referring to FIG. 2, in pixels PX shown in FIG. 1, a color filter CF may be formed on a region of the common electrode CE on the second substrate 200 to face a pixel electrode PE on the first substrate 100. A pixel PX may be connected to an $i^{th}$ (i=1 to n) gate line Gi and a $j^{th}$ (j=1 to m) data line Dj. In addition, the pixel PX may include a pixel switching device Q, which is connected to the $i^{th}$ gate line Gi and the $j^{th}$ data line Dj, and a liquid crystal capacitor Clc and a storage capacitor Cst, which are connected to the pixel switching device Q. A common voltage may be applied to the common electrode CE and an end of the storage capacitor Cst. In other exemplary embodiments, the storage capacitor Cst may be omitted.

The pixel switching device Q is a three-terminal device formed on the first substrate 100. That is, the pixel switching device Q includes a control terminal that is connected to the $i^{th}$ gate line Gi, an input terminal which is connected to the $j^{th}$ data line Dj, and an output terminal which is connected to the pixel electrode, the liquid crystal capacitor Clc, and the storage capacitor Cst. An electric field formed between the pixel electrode PE and the common electrode CE changes a direction in which liquid crystal molecules of the liquid crystal layer 3 are aligned, thereby adjusting the polarization of light that passes through the liquid crystal layer 3. Ultimately, the polarization of light may effect the transmission of the light through an exit polarizer of the display.

Referring back to FIG. 1, the non-display area PA may be where no images are displayed because the first substrate 100 (see FIG. 2) may be wider than the second substrate 200 (see FIG. 2). The non-display area PA may include a gate driver 400 and a data driver 500.

The gate driver 400 is connected to the gate lines G1 through Gn of the display area DA and transmits a gate signal, which is a combination of a gate-on voltage Von or a gate-off voltage Voff, to each of the gate lines G1 through Gn. The data driver 500 is connected to the data lines D1 through Dm of the display area DA and transmits a data signal to each of the data lines D1 through Dm. The gate driver 400 and the data driver 500 may include a plurality of TFTs (not shown) to generate and control a gate signal or a data signal.

As described above, a plurality of TFTs are formed on the display panel 300. To distinguish TFTs Qd formed on the non-display area PA, which includes the gate driver 400 and the data driver 500, from TFTs Qp formed on the display area DA, which includes the pixels PX, the term 'driver' may be attached to the TFTs Qd on the non-display area PA, and the term 'pixel' may be attached to the TFTs Qp on the display area DA Hereinafter, a method of fabricating a TFT substrate according to an exemplary embodiment of the present invention will be described with reference to FIG. 3, FIG. 4, FIG. 5, FIG. 6, FIG. 7, FIG. 8, FIG. 9, FIG. 10, FIG. 11, and FIG. 12.

Figure 3:
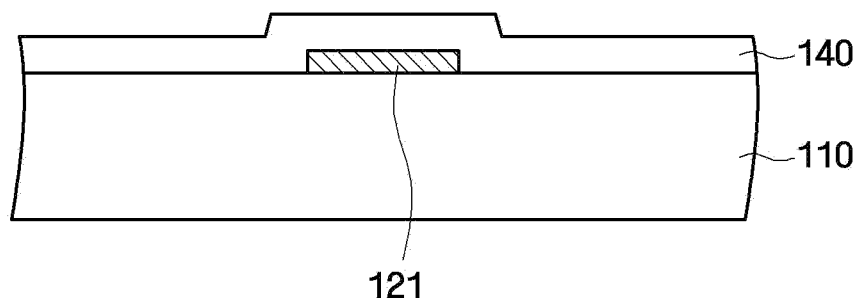
FIG. 3, FIG. 4, FIG. 5, FIG. 6, FIG. 7, FIG. 8, FIG. 9, FIG. 10, FIG. 11, and FIG. 12 are cross-sectional views of intermediate structures involved in a method of fabricating a TFT substrate according to an exemplary embodiment of the present invention.

Referring to FIG. 3, a gate electrode 121 is formed on a substrate 110, and a gate insulating film 140 is formed on the gate electrode 121.

More specifically, a gate conductive film (not shown) may be formed on the substrate 110 and may then be patterned to form the gate electrode 121. The gate electrode 121 may be made of a material with high electrical conductivity, for example, an aluminum (Al)-based metal such as aluminum and an aluminum alloy, a silver (Ag)-based metal such as silver and a silver alloy, a copper (Cu)-based metal such as copper and a copper alloy, a molybdenum (Mo)-based metal such as molybdenum and a molybdenum alloy, chromium (Cr), titanium (Ti) or tantalum (Ta). Alternatively, the gate electrode 121 may have a multi-film structure composed of two conductive films (not shown) with different physical characteristics. However, the above materials are merely one example of a material that can be used to form the gate electrode 121, and various other materials can also be used.

Next, the gate insulating film 140 is formed on the gate electrode 121. The gate insulating film 140 may be, for example, a silicon oxide film, a silicon nitride film, or a silicon oxynitride film formed by chemical vapor deposition (CVD).

Referring to FIG. 4, FIG. 5, FIG. 6, and FIG. 7, an amorphous semiconductor pattern 151 is formed on the gate insulating film 140, and a source electrode 177 and a drain electrode 178, which are separated from each other, are formed on the amorphous semiconductor pattern 151.

Figure 4:
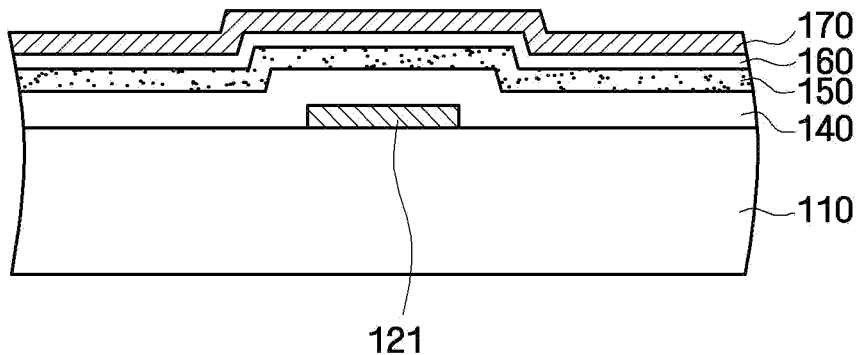

More specifically, referring to FIG. 4, an amorphous semiconductor layer 150, an ohmic contact layer 160, and a metal layer 170 may be sequentially stacked on the gate insulating film 140.

The amorphous semiconductor layer 150 and the ohmic contact layer 160 may be successively deposited by using, e.g., CVD. Here, the amorphous semiconductor layer 150 may be made of hydrogenated amorphous silicon. In addition, the ohmic contact layer 160 may be made of, e.g., n+ hydrogenated amorphous silicon that may be heavily doped with impurities such as phosphorous (P), n+ crystalline silicon, or silicide. Further, the metal layer 170 may be formed using, e.g., sputtering.

Figure 5:
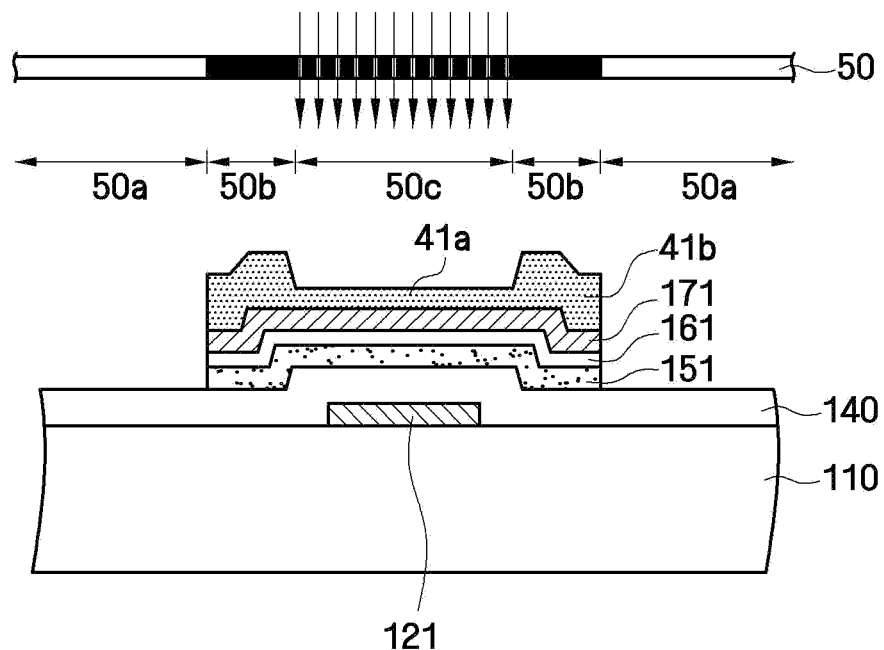

Referring to FIG. 5, a photosensitive film (not shown) is coated on the metal layer 170 (see FIG. 4) and is then exposed to light by using a mask 50. The exposed photosensitive film is developed to form first and second photosensitive patterns 41*a* and 41*b*.

Here, the mask 50 may include a light-transmitting region 50*a*, a light-blocking region 50*b*, and a semi-light-transmitting region 50*c*. The semi-light-transmitting region 50*c* may have slit patterns, lattice patterns, or halftone patterns of medium transmittance or thickness. When slit patterns are used, a width of the slit patterns or a gap between the slit patterns should be smaller than the resolution of an exposure device used in a photolithography process.

After the photosensitive film exposed to light by using the mask 50 is developed, the first photosensitive pattern 41*a* and the second photosensitive pattern 41*b*, which is thicker than the first photosensitive pattern 41*a*, may be formed. More specifically, the first photosensitive pattern 41*a* may be formed at a location corresponding to a channel region of the amorphous semiconductor pattern 151, and the second photosensitive pattern 41*b* may be formed at locations at which the source electrode 177 and the drain electrode 178 are to be formed.

In FIG. 5, a case where a photoresist with positive photosensitivity is employed is shown. That is, a portion of the photosensitive film which corresponds to the light-transmitting region 50*a* is completely removed, a portion of the photosensitive film which corresponds to the light-blocking region 50*b* remains intact, and a portion of the photosensitive film which corresponds to the semi-light-transmitting region 50*c* is partially removed, to produce the first and second photosensitive patterns 41*a* and 41*b*. However, a photoresist with negative photosensitivity also may be employed according to the purpose of patterning. In this case, the light-transmitting region 50*a*, the light-blocking region 50*b*, and the semi-light-transmitting region 50*c* may be applied in reverse, i.e., replacing light-transmitting regions with light-blocking regions.

Next, the metal layer 170 (see FIG. 4), the ohmic contact layer 160 (see FIG. 4), and the semiconductor layer 150 (see FIG. 4) are sequentially etched by using the first and second photosensitive patterns 41*a* and 41*b* as an etch mask. As a result, a preliminary source and drain electrode 171, a preliminary ohmic contact pattern 161, and the amorphous semiconductor pattern 151 are formed.

Figure 6:
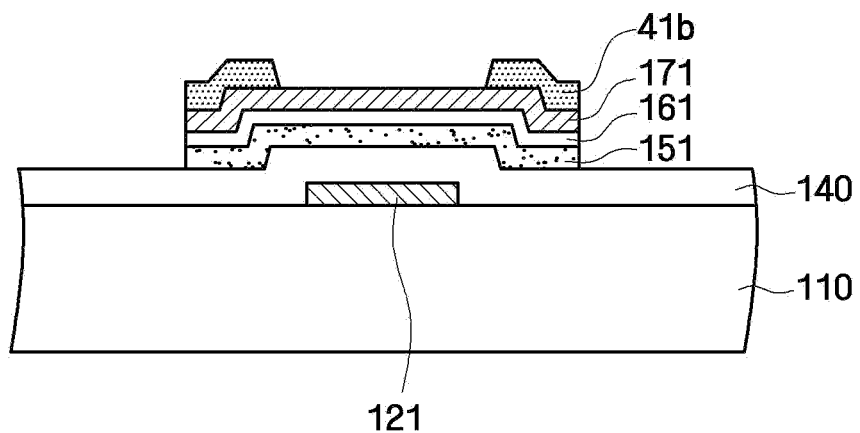
Figure 7:
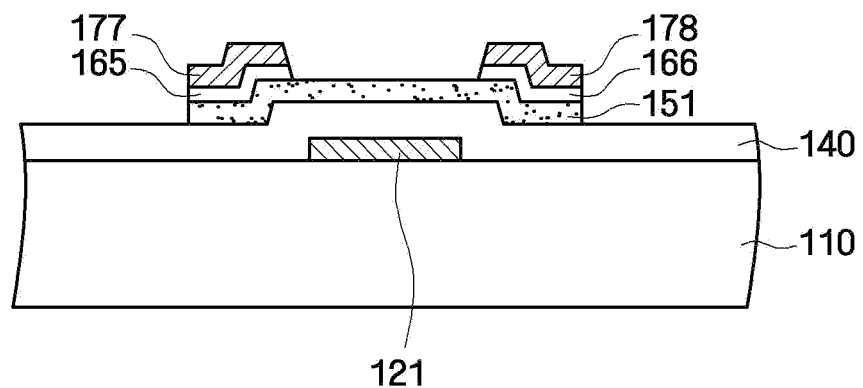

More specifically, referring to FIG. 6 and FIG. 7, the first photosensitive pattern 41*a* (see FIG. 5) may be removed by an etch-back process such as ashing. Here, the thickness of the second photosensitive pattern 41*b* may also be reduced. Then, the preliminary source and drain electrode 171 may be etched by using the remaining second photosensitive pattern 41*b* as an etch mask, thereby forming the source electrode 177 and the drain electrode 178. Accordingly, a portion of the preliminary ohmic contact pattern 161, which is disposed between the source electrode 177 and the drain electrode 178, may be exposed.

The exposed portion of the preliminary ohmic contact pattern 161 may be dry-etched to form ohmic contact patterns 165 and 166. Accordingly, a portion of the amorphous semiconductor pattern 151 may be exposed. In other exemplary embodiments, a thickness of the exposed portion of the amorphous semiconductor pattern 151 under the ohmic contact patterns 165 and 166 may be reduced by a certain amount. This is referred to as "back-channel etching."

A method of forming the amorphous semiconductor pattern 151 on the gate insulating film 140 and forming the source electrode 177 and the drain electrode 178, which are separated from each other, on the amorphous semiconductor pattern 151 is not limited to the method described above as shown in FIG. 5, FIG. 6, and FIG. 7 and may vary.

Figure 8:
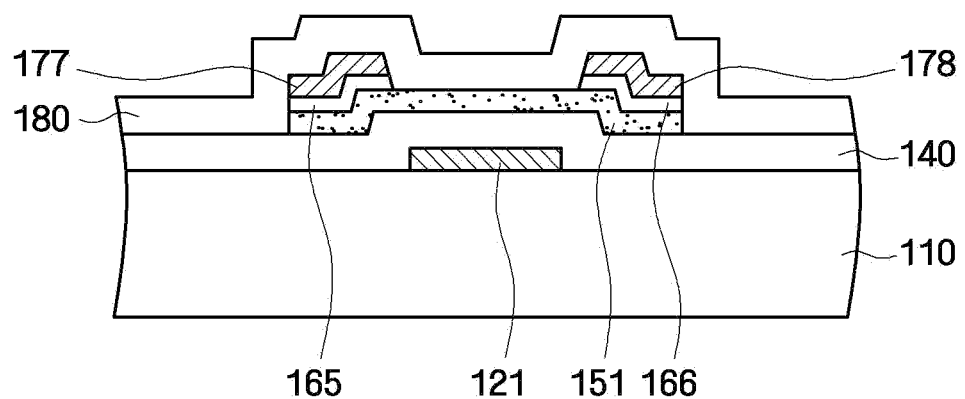

Next, referring to FIG. 8, a passivation film 180 may be formed on the amorphous semiconductor pattern 151, the source electrode 177, the drain electrode 178, and the gate insulating layer 140. The passivation film 180 may be a silicon oxide film, a silicon nitride film, or a silicon oxynitride film formed by using, e.g., CVD.

Figure 9:
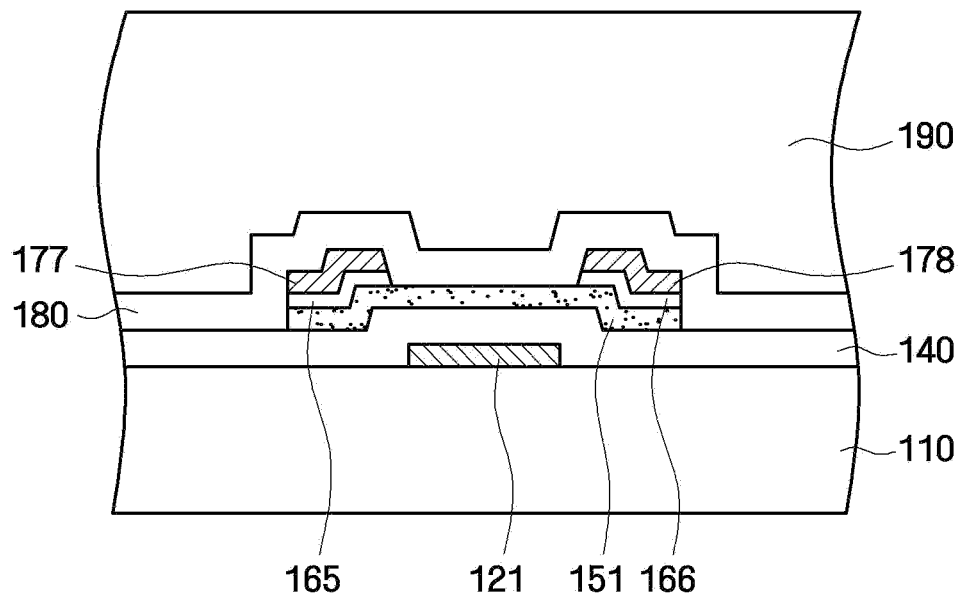

Referring to FIG. 9, a preliminary light-concentrating layer 190 may be formed on the amorphous semiconductor pattern 151 under the source electrode 177 and the drain electrode 178. The preliminary light-concentrating layer 190 may be formed by, e.g., CVD. As described above, the passivation film 180 may be disposed under the preliminary light-concentrating layer 190.

The preliminary light-concentrating layer 190 may be an organic or inorganic layer. When the preliminary light-concentrating layer 190 is an inorganic layer, a protrusion 194 (see FIG. 10) of a light-concentrating layer 192 (described below) may be used as a column spacer.

Figure 10:
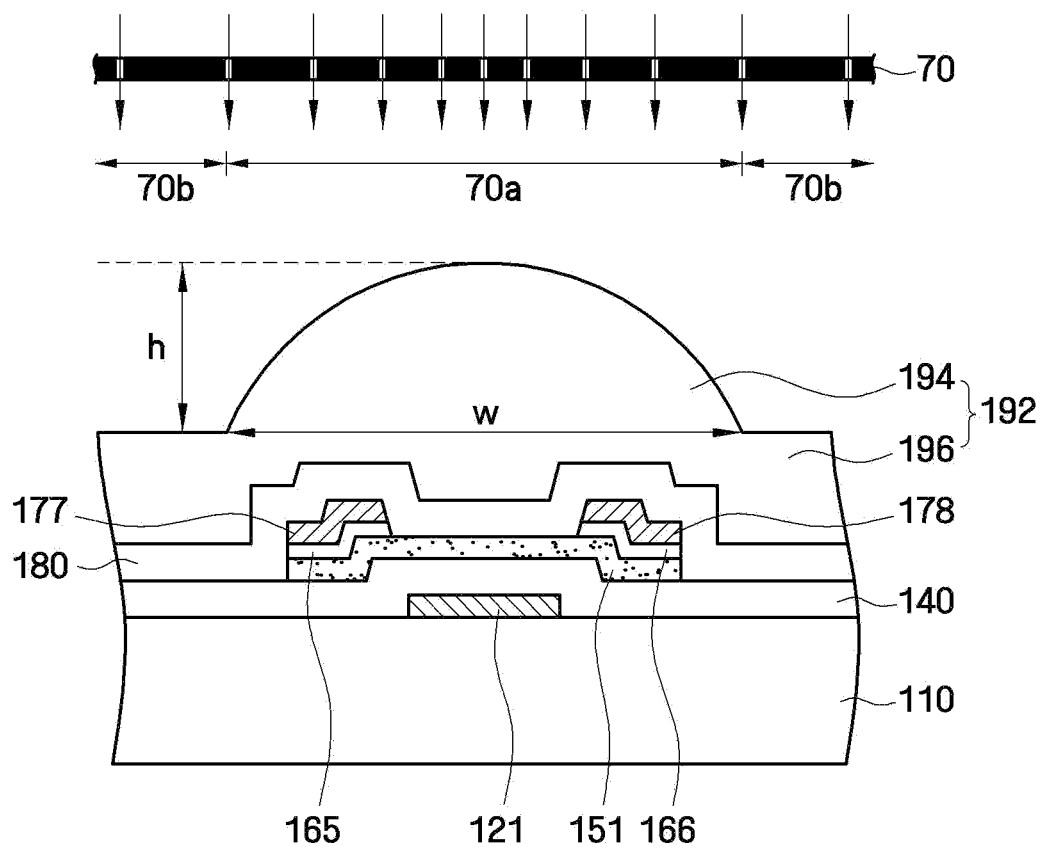

Referring to FIG. 10, the light-concentrating layer 192, which includes the protrusion 194 disposed on the amorphous semiconductor pattern 151 under the source electrode 177 and the drain electrode 178, is formed on the amorphous semiconductor pattern 151, the source electrode 177, and the drain electrode 178.

More specifically, the preliminary light-concentrating layer 190 (see FIG. 9) may be exposed to light by using a mask 70 having first and second slit portions 70*a* and 70*b*. Referring to FIG. 10, the light-concentrating layer 192 includes the protrusion 194 and a flat portion 196 that connects the protrusion 194 to another adjacent protrusion of the light-concentrating layer 190. The mask 70 may be disposed such that the first slit portion 70*a* corresponds to the protrusion 194 and the second slit portion 70*b* corresponds to the flat portion 196.

In other words, the preliminary light-concentrating layer 190 may be exposed to light by using the mask 70, which includes the first slit portion 70*a* and the second slit portion 70*b*. Then, the exposed preliminary light-concentrating layer 190 may be developed to form the light-concentrating layer 192 having the protrusion 194.

The protrusion 194 may be shaped like a lens with an arbitrary surface curvature, for example, the convex shape shown in FIG. 10. If the protrusion 194 is shaped like a lens having an arbitrary curvature, when light is irradiated to the amorphous semiconductor pattern 151 in a subsequent crystallization process of the amorphous semiconductor pattern 151, the irradiated light can be focused on the amorphous semiconductor pattern 151 by the protrusion 194. Accordingly, the amorphous semiconductor pattern 151 may be crystallized with a light having relatively low energy (described below).

In FIG. 10, the protrusion 194 is lens-shaped. However, the protrusion 194 may have any shape as long as it focuses light onto the amorphous semiconductor pattern 151 in the crystallization process of the amorphous semiconductor pattern 151.

As described above, the mask 70 may include the first slit portion 70a and the second slit portion 70b. For example, when the light-concentrating layer 192 has negative photosensitivity, slit patterns of the first slit portion 70a may be formed more densely than slit patterns of the second slit portion 70b, as shown in the drawing. Furthermore, even within the first slit portion 70a, the density of slit patterns may vary according to the shape of the protrusion 194. For example, when the protrusion 194 is lens-shaped as shown in FIG. 10, the density of slit patterns of the first slit portion 70a may increase toward the center of the protrusion 194.

The protrusion 194 may have a width w and a height h. The width w of the protrusion 194 may be the distance from a side of a boundary surface between the flat portion 196 and the protrusion 194 to the other side of the boundary surface, i.e., a distal position. The height h of the protrusion 194 may be the distance from a top surface of the flat portion 196 to a highest spot on the protrusion 194. Here, the width w of the protrusion 194 may range from approximately 1.2 to 4 times the height h of the protrusion 194. Further, the height h of the protrusion 194 may be approximately 1.4 µm to 5 µm. The protrusion 194 can also be used as a column spacer, depending on the height h of the protrusion 194. In this case, the light-concentrating layer 192 may be an inorganic layer. The above dimensions of the width w and the height h of the protrusion 194 are exemplary and may vary.

In FIG. 10, the light-concentrating layer 192 includes only one protrusion 194. However, the light-concentrating layer 192 may also include a plurality of protrusions. More specifically, a plurality of source electrodes 177 and a plurality of drain electrodes 178 may be formed on the substrate 110 and separated from each other, and a plurality of protrusions 194 may be formed respectively on a plurality of amorphous semiconductor patterns 151 under the source electrodes 177 and the drain electrodes 178. In other exemplary embodiments, the protrusions 194 may not be formed respectively on all of the amorphous semiconductor patterns 151 under the source electrodes 177 and the drain electrodes 178. An exemplary embodiment of this is described below.

Figure 11:
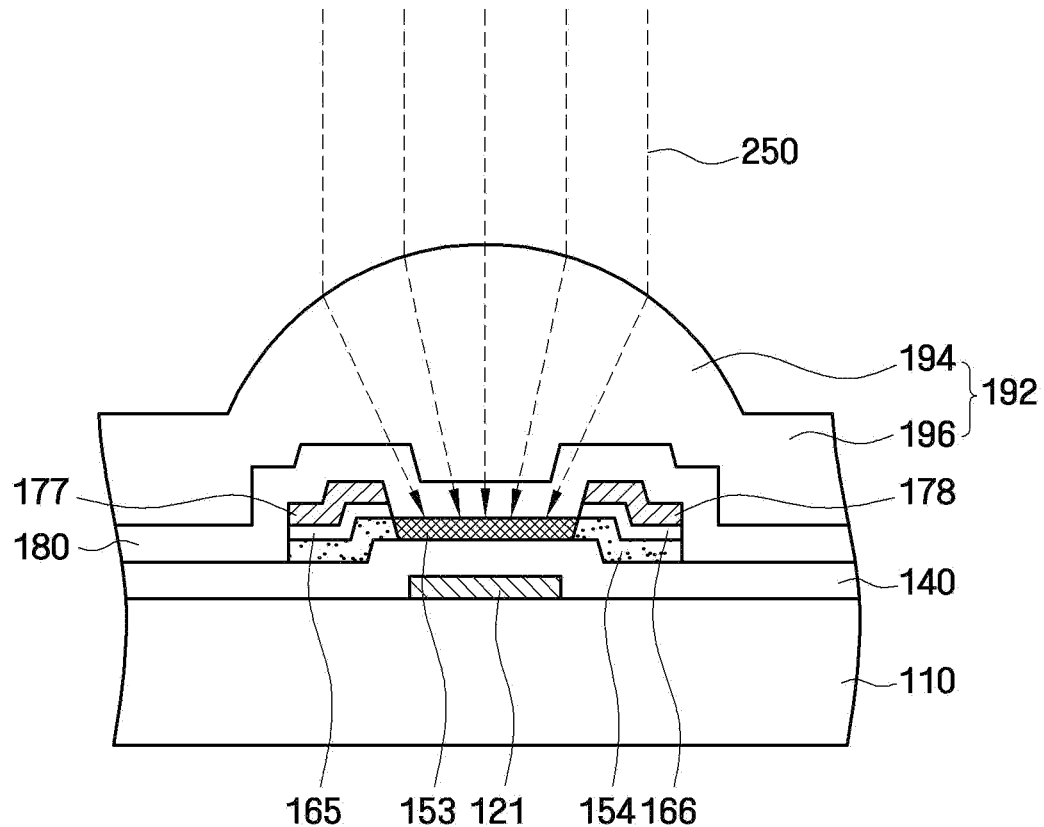

Referring to FIG. 11, light irradiates the protrusion 194 of the light-concentrating layer 192, thereby crystallizing at least part of the amorphous semiconductor pattern 151.

Specifically, light, e.g., a laser beam 250 may irradiate the amorphous semiconductor pattern 151. Accordingly, at least part of the amorphous semiconductor pattern 151 may be crystallized and converted into a polycrystalline semiconductor pattern 153. More specifically, the laser beam 250 may irradiate the protrusion 194 shaped like, e.g., a lens. Then, the laser beam 250 may be focused by the protrusion 194 onto the amorphous semiconductor pattern 151. In other words, parallel rays of the laser beam 250 propagating outside the light-concentrating layer 192 may be refracted by the protrusion 194 and focused onto the amorphous semiconductor pattern 151.

Since the laser beam 250 may be focused on the channel region by using the protrusion 194, even when the laser beam 250 has a relatively low energy, the channel region, i.e., at least part of the amorphous semiconductor pattern 151, may be crystallized with the laser beam 250 due to the fluence increase caused by the protrusion 194, i.e., the focusing of the light caused by the protrusion 194. This selective crystallization of the amorphous semiconductor pattern 151 may significantly increase processing speed and processing efficiency.

Furthermore, since a laser beam 250 with relatively low energy may be adequate for crystallization of the amorphous semiconductor pattern 151, a larger cross-sectional area laser beam 250 may be generated using a laser of the same power. This allows the crystallization process to be performed more efficiently.

More specifically, although not shown in FIG. 11, the light-concentrating layer 192 may include a plurality of protrusions 194, and the protrusions 194 may be divided into a plurality of protrusion groups, each including one or more protrusions 194. Here, the laser beam 250 may be irradiated onto the protrusions 194 included in a protrusion group.

As described above, a larger cross-sectional area laser beam 250 may be generated using a laser of the same power. Thus, a plurality of protrusions 194 may be irradiated with a single pulse of the laser beam 250, and another plurality of protrusions 194 may be irradiated with a next pulse of the laser beam 250 if using a pulsed or modulated laser. That is, the irradiation of the laser beam 250 can be performed on a group-by-a group basis, thereby allowing the crystallization process to be performed rapidly. Therefore, processing speed may be increased despite an increase in the size of the substrate 110. Although laser pulses are mentioned here, a continuous-wave laser may also be used. In that case, the laser may raster across the substrate 110 and irradiates the groups of protrusions 194.

Although the laser beam 250 may have a large cross-sectional area compared with a channel region, a portion of the amorphous semiconductor pattern 151, which is exposed between the source electrode 177 and the drain electrode 178, may be crystallized with the laser beam 250 due the focusing nature of the protrusion 194. The focusing behavior alleviates the need for sophisticated optical technology and a precision stage for maintaining uniformity between pulses of the laser beam 250. Accordingly, the crystallization process may be performed as size of the substrate 110 increases, and a TFT substrate including defect-free transistors may be fabricated on large substrates 110.

Since the protrusion 194 focuses light, the energy of the laser beam 250 irradiated onto the substrate 110 may be relatively low. More specifically, if light having a first energy is required to crystallize an amorphous semiconductor pattern on which the protrusion 194 is not formed, light having a second energy that is less than the first energy may crystallize the amorphous semiconductor pattern 151 on which the protrusion 194 is formed.

Therefore, even when the laser beam 250 having the second energy is irradiated to the whole of a region of the substrate 110, for example, a region occupied by any one of the protrusion groups, it may not damage metal portions such as the source electrode 177, the drain electrode 178, or other elements. That is, the fluence of the laser beam 250 may be high enough to crystallize the amorphous semiconductor pattern 151 after focusing by the protrusion 194 but may be too low to damage other regions.

The laser beam 250 may not be absorbed by the passivation film 180 but may pass through the passivation film 180 to reach the amorphous semiconductor pattern 151. Accordingly, a portion of the amorphous semiconductor pattern 151, which is exposed between the source electrode 177 and the drain electrode 178, may be converted into the polycrystalline semiconductor pattern 153.

Figure 12:
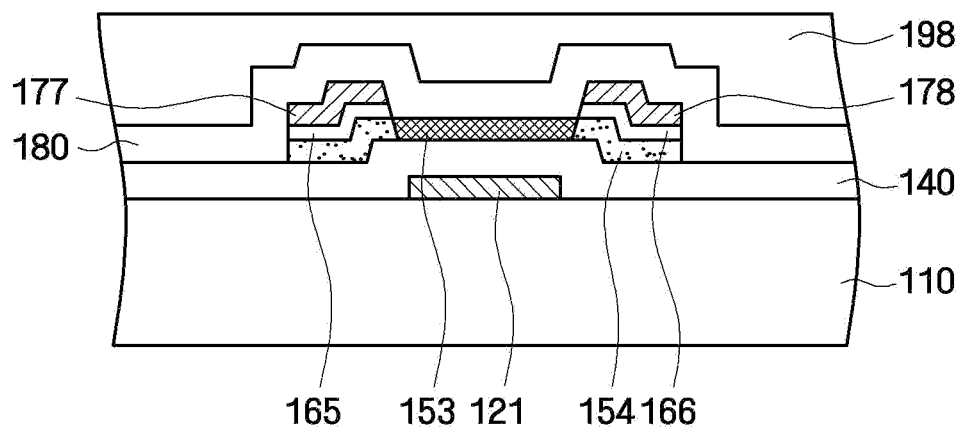

Referring to FIG. 12, after at least part of the amorphous semiconductor pattern 151 is crystallized, the light-concentrating layer 192 is planarized to remove the protrusion 194 (see FIG. 11). The protrusion 194 may be removed by, e.g., chemical mechanical polishing (CMP). Although not shown in the drawing, a plurality of contact holes (not shown) may be formed in the passivation film 180 and the light-concentrating layer 192 from which the protrusion 194 has been removed. The contact holes may penetrate the light-concentrating layer 192 and the passivation film 180 to expose the source electrode 177 and the drain electrode 178. The source electrode 177 and the drain electrode 178 may be electrically connected to wires, a pixel electrode, a storage electrode, or the like by the contact holes.

In other exemplary embodiments, after at least part of the amorphous semiconductor pattern 151 is crystallized, the protrusion 194 of the light-concentrating layer 192 may not be removed but may be used as a column spacer of a display device. Therefore, the height h (see FIG. 10) of the protrusion 194 may correspond to a height required for a column spacer of a display device including a TFT substrate according to exemplary embodiments of the present invention. For example, the height h of the protrusion 194 may range from approximately 1.4 µm to 5 µm. However, the height h of the protrusion 194 is not so limited and may vary according to the size or use of the display device.

Figure 13:
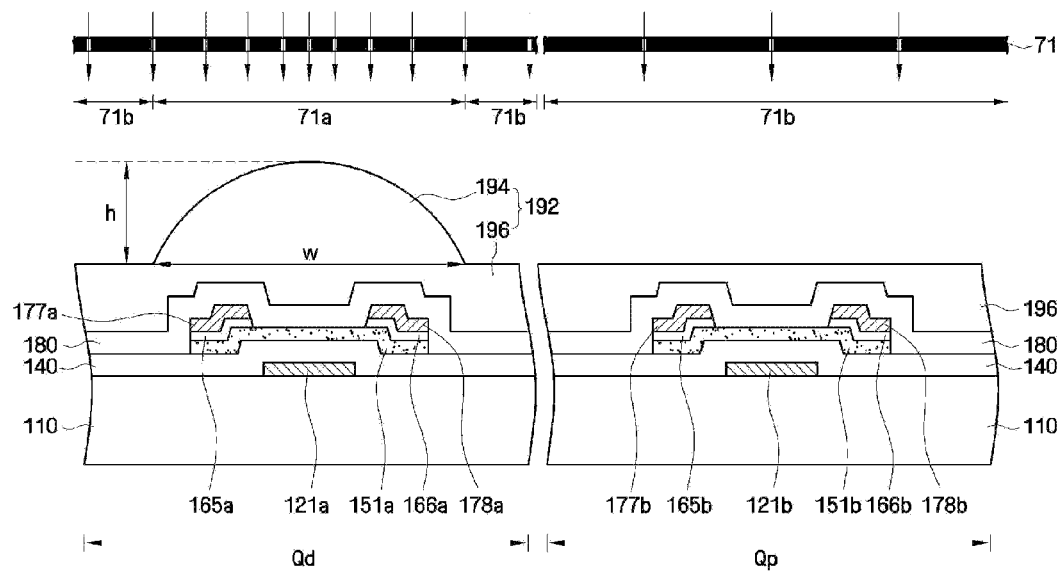
FIG. 13 and FIG. 14 are cross-sectional views of intermediate structures involved in a method of fabricating a TFT substrate according to another exemplary embodiment of the present invention.
Figure 14:
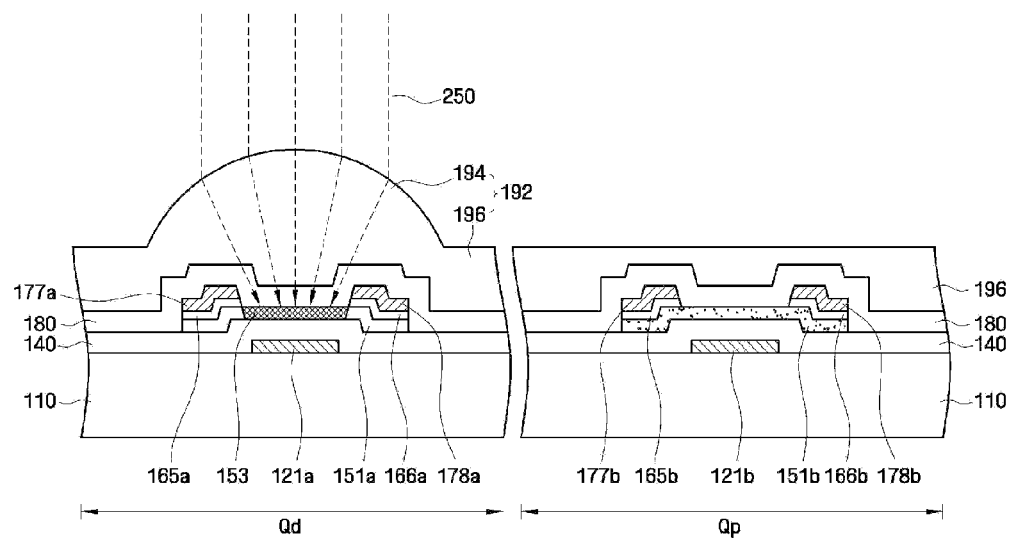

Hereinafter, a method of fabricating a TFT substrate according to another exemplary embodiment of the present invention is described with reference to FIG. 13 and FIG. 14. FIG. 13 and FIG. 14 are cross-sectional views of intermediate structures involved in a method of fabricating a TFT substrate according to another exemplary embodiment of the present invention.

The TFT substrate according to this exemplary embodiment is different from the TFT substrate of the previous exemplary embodiment in that a plurality of TFTs is divided into driver TFTs Qd and pixel TFTs Qp, and a light-concentrating layer 192, which includes a protrusion 194 disposed only on an amorphous semiconductor pattern (i.e., a circuit amorphous semiconductor pattern) of each driver TFT Qd, is formed. For simplicity, elements substantially similar to those of the previously-described exemplary embodiment are indicated by like reference numerals, and repeated descriptions may be abbreviated or omitted.

Referring to FIG. 13, a circuit gate electrode 121a and a pixel gate electrode 121b are formed on a substrate 110, and a gate insulating film 140 is formed on the circuit gate electrode 121a and the pixel gate electrode 121b. Then, a circuit amorphous semiconductor pattern 151a and a pixel amorphous semiconductor pattern 151b are formed on the gate insulating film 140. Thereafter, a circuit source electrode 177a and a circuit drain electrode 178a, which are separated from each other, are formed on the circuit amorphous semiconductor pattern 151a. A pixel source electrode 177b and a pixel drain electrode 178b, which are separated from each other, are formed on the pixel amorphous semiconductor pattern 151b.

More specifically, as shown in FIG. 13, the circuit gate electrode 121a, the circuit amorphous semiconductor pattern 151a, the circuit source electrode 177a, and the circuit drain electrode 178a form a driver TFT Qd, and the pixel gate electrode 121b, the pixel amorphous semiconductor pattern 151b, the pixel source electrode 177b, and the pixel drain electrode 178b form a pixel TFT Qp.

The circuit amorphous semiconductor pattern 151a and the pixel amorphous semiconductor pattern 151b may contain, for example, amorphous silicon. However, in a light irradiation process (described below), at least part of the circuit amorphous semiconductor pattern 151a of the driver TFT Qd may be converted into a polycrystalline semiconductor pattern 153.

Using substantially similar processes to those described above with reference to FIG. 3, FIG. 4, FIG. 5, FIG. 6, and FIG. 7, the circuit gate electrode 121a, the pixel gate electrode 121b, the gate insulating film 140, the circuit source electrode 177a, the pixel source electrode 177b, the circuit drain electrode 178a, and the pixel drain electrode 178b may be formed. Further, as shown in FIG. 13, ohmic contact patterns 165a, 165b, 166a, and 166b may be formed under the circuit and pixel source electrodes 177a and 177b and the circuit and pixel drain electrodes 178a and 178b. In addition, the pixel gate electrode 121b may be formed narrower than the circuit gate electrode 121a.

Next, the light-concentrating layer 192, which includes the protrusion 194 disposed only on the circuit amorphous semiconductor pattern 151a that is under the circuit source and drain electrodes 177a and 178a, is formed on the amorphous semiconductor patterns 151a and 151b, the circuit source electrode 177a, the circuit drain electrode 178a, the pixel source electrode 177b, and the pixel drain electrode 178b.

While the protrusion 194 is formed on the circuit amorphous semiconductor pattern 151a, it may not be formed on the pixel amorphous semiconductor pattern 151b under the pixel source electrode 177b and the pixel drain electrode 178b. Accordingly, in the light irradiation process (described below), the pixel amorphous semiconductor pattern 151b may not be crystallized, whereas at least part of the circuit amorphous semiconductor pattern 151a is crystallized. This is described in greater detail with reference to FIG. 14.

A passivation film 180 may be formed under the light-concentrating layer 192. That is, the passivation film 180, which covers the driver TFT Qd and the pixel TFT Qp, may be formed before the formation of the light-concentrating layer 192 including the protrusion portion 194.

More specifically, a preliminary light-concentrating layer (see element 190 in FIG. 9) may be formed on the amorphous semiconductor patterns 151a and 151b, the circuit source electrode 177a, the circuit drain electrode 178a, the pixel source electrode 177b, and the pixel drain electrode 178b and may then be exposed to light by using a mask 71 having slit portions.

Next, referring again to FIG. 13, the light-concentrating layer 192 includes the protrusion 194 and a flat portion 196 that connects the protrusion 194 to another adjacent protrusion. The mask 71 may include a first slit portion 71a and a second slit portion 71b. The mask 71 may be disposed such that the first slit portion 71a corresponds to the protrusion 194 and such that the second slit portion 71b corresponds to the flat portion 196. Accordingly, the first slit portion 71a may correspond to the circuit amorphous semiconductor pattern 151a of the driver TFT Qd, and the second slit portion 71b may correspond to the flat portion 196 of the light-concentrating layer 192, for example, part of the driver TFT Qd and the pixel TFT Qp. In other words, the flat portion 196 of the light-concentrating layer 192 may be formed on the pixel TFT Qp.

Slit patterns of the first and second slit portions 71a and 71b and the shape of the protrusion 194 are substantially similar to those described above in the previous exemplary embodiment.

Next, referring to FIG. 14, light is irradiated to the protrusion 194 of the light-concentrating layer 192, thereby crystallizing at least part of the circuit amorphous semiconductor pattern 151a.

More specifically, light, e.g., a laser beam 250 may irradiate the protrusion 194. Then, the laser beam 250 may be focused on a portion of the circuit amorphous semiconductor pattern 151, which is exposed between the circuit source electrode 177a and the circuit drain electrode 178a, by the protrusion 194.

Although not shown in the drawing, in some exemplary embodiments, the laser beam 250 may irradiate a region of the substrate 110. As described above, since the laser beam 250 can be focused by the protrusion 194, even when the laser beam 250 has a relatively low energy, at least part of the circuit amorphous semiconductor pattern 151a may be converted into a polycrystalline semiconductor pattern 153 by using the laser beam 250 focused by the protrusion 194.

In other words, if light having a first fluence does not crystallize the pixel amorphous semiconductor pattern 151b on which the protrusion 194 is not formed, light having a second fluence (which is greater than the first fluence) may crystallize the circuit amorphous semiconductor pattern 151a on which the protrusion 194 is formed even though the light issues from the same laser source. That is, since the protrusion 194 focuses the laser beam 250, the circuit amorphous semiconductor pattern 151a may be crystallized with the laser beam 250. A detailed description of the first fluence, the second fluence, and the irradiation of light having the second fluence is substantially similar to the above descriptions.

In the method of fabricating the TFT substrate according to the current exemplary embodiment, only the circuit amorphous semiconductor pattern 151a of the driver TFT Qd may be crystallized when the driver TFT Qd and the pixel TFT Qp are formed. This selective crystallization alleviates sophisticated optical technology and a precision stage for maintaining uniformity between pulses of the laser beam 250. Accordingly, processing efficiency and processing speed may be significantly increased.

While the present invention has been shown and described with reference to exemplary embodiments, it will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A method of fabricating a thin-film transistor (TFT) substrate, the method comprising:
    forming a gate electrode on a substrate;
    forming an insulating film on the gate electrode;
    forming an amorphous semiconductor pattern on the insulating film;
    forming a source electrode and a drain electrode, which are spaced from each other, on the amorphous semiconductor pattern;
    forming a light-concentrating layer comprising a protrusion on the amorphous semiconductor pattern, the source electrode, and the drain electrode, the position of the protrusion corresponding to the amorphous semiconductor pattern; and
    crystallizing at least part of the amorphous semiconductor pattern by irradiating light to the protrusion.

2. The method of claim 1, wherein forming the light-concentrating layer comprises:
    forming a preliminary light-concentrating layer on the amorphous semiconductor pattern, the source electrode, and the drain electrode; and
    exposing the preliminary light-concentrating layer to light using a mask comprising slit portions.

3. The method of claim 2, wherein the light-concentrating layer comprises the protrusion and a flat portion that connects the protrusion to an adjacent protrusion, the slit portions comprise a first slit portion and a second slit portion, and exposing the preliminary light-concentrating layer comprises arranging the mask such that the first slit portion corresponds to the protrusion and the second slit portion corresponds to the flat portion.

4. The method of claim 1, wherein the light-concentrating layer is an organic layer.

5. The method of claim 1, wherein the light-concentrating layer comprises a plurality of protrusions, wherein the protrusions are divided into a plurality of protrusion groups, each protrusion group comprising one or more protrusions, and irradiating the light to the protrusion comprises irradiating the protrusions of the protrusion groups.

6. The method of claim 1, wherein the protrusion has a lens shape.

7. The method of claim 6, wherein irradiating the light to the protrusion comprises irradiating the lens-shaped protrusion such that the light is focused on a portion of the amorphous semiconductor pattern exposed by the separation between the source electrode and the drain electrode.

8. The method of claim 1, further comprising removing the protrusion by planarizing the light-concentrating layer after crystallizing at least part of the amorphous semiconductor pattern.

9. The method of claim 1, wherein the light-concentrating layer is an inorganic layer, and a spacer for the TFT substrate comprises the protrusion.

10. The method of claim 1, wherein a height of the protrusion ranges from 1.4 μm to 5 μm.

11. The method of claim 1, wherein a width of the protrusion ranges from 1.2 to 4 times a height of the protrusion.

12. The method of claim 1, wherein a portion of the amorphous semiconductor pattern is exposed by the separation between the source electrode and the drain electrode, and the light is focused on the exposed portion of the amorphous semiconductor pattern by the protrusion.

13. The method of claim 1, further comprising forming a passivation film on the amorphous semiconductor pattern, the source electrode, and the drain electrode before forming the light-concentrating layer.

14. A method of fabricating a thin film transistor (TFT) substrate, the method comprising:
    forming a first gate electrode and a second gate electrode on a substrate;
    forming an insulating film on the first gate electrode and the second gate electrode;
    forming a first amorphous semiconductor pattern and a second amorphous semiconductor pattern on the insulating film, forming a first source electrode and a first drain electrode, which are spaced apart from each other, on the first amorphous semiconductor pattern, and forming a second source electrode and a second drain electrode, which are spaced apart from each other, on the second amorphous semiconductor pattern;
    forming a light-concentrating layer comprising a protrusion on the first amorphous semiconductor pattern, the second amorphous semiconductor pattern, the first source electrode, the first drain electrode, the second source electrode, and the second drain electrode; and
    crystallizing at least part of the first amorphous semiconductor pattern by irradiating light to the protrusion of the light-concentrating layer, wherein the protrusion corresponds to a portion of the first amorphous semiconductor pattern exposed by a separation between the first source electrode and the first drain electrode.

15. The method of claim 14, wherein forming the light-concentrating layer comprises forming the protrusion on the first amorphous semiconductor pattern while not forming the protrusion on the second amorphous semiconductor pattern.

16. The method of claim 15, wherein the light irradiating the protrusion to crystallize the first amorphous semiconductor pattern has a greater fluence than light irradiating the second amorphous semiconductor pattern so that the second amorphous semiconductor pattern remains amorphous.

17. The method of claim 14, wherein forming the light-concentrating layer comprises:
   forming a preliminary light-concentrating layer on the first amorphous semiconductor pattern, the second amorphous semiconductor pattern, the first source electrode, the first drain electrode, the second source electrode, and the second drain electrode; and
   exposing the preliminary light-concentrating layer to light using a mask having slit portions.

18. The method of claim 17, wherein the light-concentrating layer is an organic layer.

19. The method of claim 14, wherein the protrusion has a lens shape.

20. The method of claim 19, wherein irradiating the light to the protrusion comprises irradiating light to the lens-shaped protrusion such that the light is focused on a portion of the first amorphous semiconductor pattern exposed by the separation between the first source electrode and the first drain electrode.

21. A method of fabricating a thin film transistor (TFT), the method comprising:
   forming an amorphous semiconductor on a substrate;
   forming a drain electrode and a source electrode on the amorphous semiconductor, a portion of the amorphous semiconductor being exposed by a separation between the drain electrode and the source electrode;
   forming a layer comprising a protrusion on the exposed portion of the amorphous semiconductor; and
   crystallizing at least a part of the exposed portion of the amorphous semiconductor by irradiating the protrusion with light,
   wherein the protrusion focuses the light onto the exposed portion of the amorphous semiconductor.

22. The method of claim 21, further comprising planarizing the protrusion after crystallizing at least a part of the exposed portion of the amorphous semiconductor.

23. The method of claim 21, wherein the layer comprising the protrusion comprises an organic material.

24. The method of claim 21, wherein the layer comprising the protrusion comprises an inorganic material.

25. The method of claim 22, wherein planarizing the protrusion decreases a height of the protrusion.

* * * * *